United States Patent
Ikeda et al.

(10) Patent No.: US 7,368,914 B2
(45) Date of Patent: May 6, 2008

(54) MAGNETIC RESONANCE IMAGING APPARATUS AND IMAGING APPARATUS

(75) Inventors: Hitoshi Ikeda, Tokyo (JP); Antoine Choppin, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 64 days.

(21) Appl. No.: 11/438,714

(22) Filed: May 22, 2006

(65) Prior Publication Data

US 2006/0270931 A1 Nov. 30, 2006

(30) Foreign Application Priority Data

May 26, 2005 (JP) ............................. 2005-154323

(51) Int. Cl.
*G01V 3/00* (2006.01)
(52) U.S. Cl. ...................................... 324/318; 324/322
(58) Field of Classification Search ............... 324/318, 324/322, 307, 309; 600/410
See application file for complete search history.

(56) References Cited

U.S. PATENT DOCUMENTS

| | | | |
|---|---|---|---|
| 5,218,532 A * | 6/1993 | Mori | 600/410 |
| 5,482,042 A | 1/1996 | Fujita et al. | |
| 5,611,341 A | 3/1997 | Aritomi et al. | |
| 5,629,624 A | 5/1997 | Carlson et al. | |
| 6,430,428 B1 * | 8/2002 | Lindstedt | 600/410 |
| 6,683,454 B2 | 1/2004 | Rehwald et al. | |
| 6,689,059 B2 * | 2/2004 | Harder et al. | 600/300 |
| 2003/0036693 A1 | 2/2003 | Avinash et al. | |
| 2003/0188757 A1 | 10/2003 | Yanof et al. | |
| 2006/0074292 A1 | 4/2006 | Thomson et al. | |

FOREIGN PATENT DOCUMENTS

| | | |
|---|---|---|
| EP | 1 362 550 A1 | 11/2003 |
| JP | 02-098336 | 4/1990 |
| JP | 07-178066 | 7/1995 |
| JP | 2000-175881 | 6/2000 |
| JP | 2002-165775 | 6/2002 |

OTHER PUBLICATIONS

An English translation of a portion of JP 02-098336.
New Intera Release, 10.3, Application Guide/vol. 1: "Basics & Scan Methods" 2003, Royal Philips Electronics, Philips Medical Systems, Netherlands, XP002389339, See Chapters 2.8.1 and 2.8.3.
European Search Report and Opinion, European Patent Office, Reference 184072/11512, App. No. 06252649.6-2209, Date of completion of search Jul. 10 2006, 9 pages.

* cited by examiner

*Primary Examiner*—Louis M. Arana
(74) *Attorney, Agent, or Firm*—Armstrong Teasdale LLP

(57) ABSTRACT

The present invention is intended to improve imaging efficiency and maneuverability. A dynamic scanning initiation block initiates dynamic scanning in which a plurality of scans is sequentially performed with a time interval between adjoining scans. A dynamic scanning suspension block suspends the dynamic scanning initiated by the dynamic scanning initiation block. A dynamic scanning resumption block resumes the dynamic scanning suspended by the dynamic scanning suspension block.

18 Claims, 10 Drawing Sheets

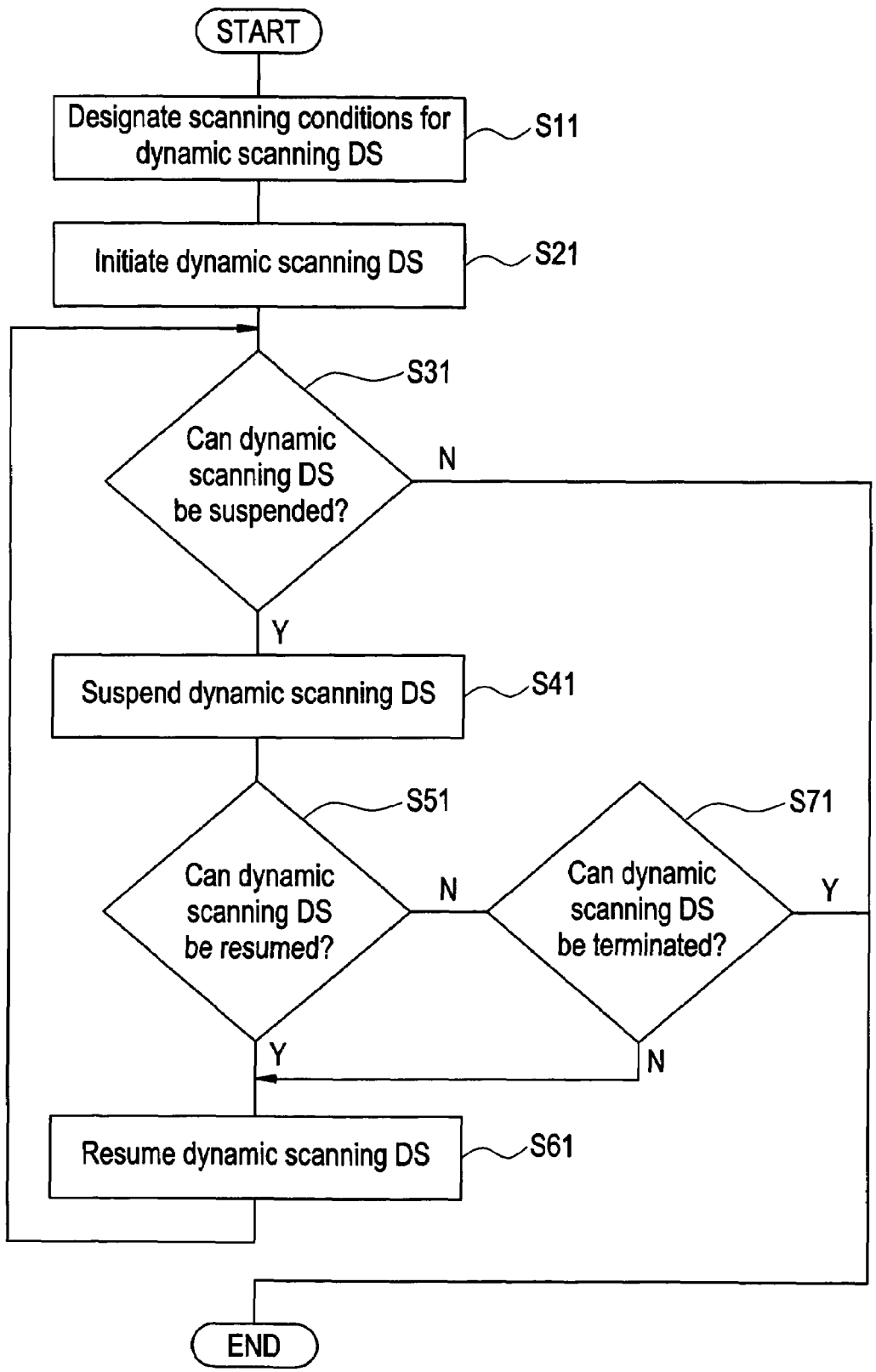

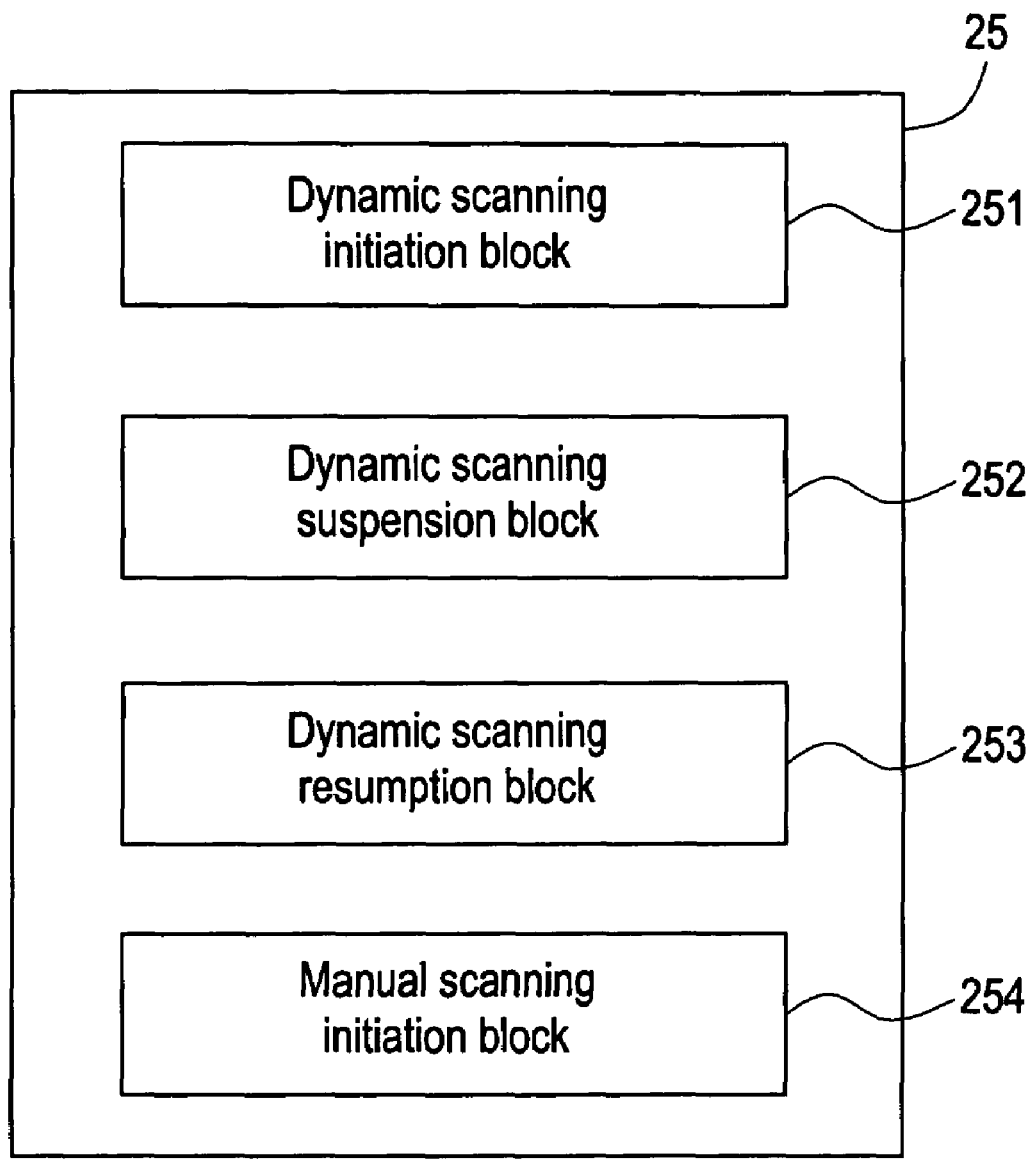

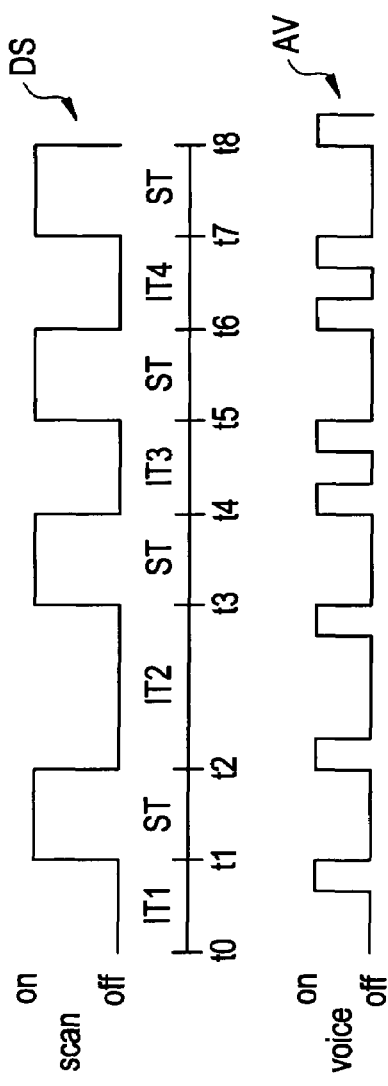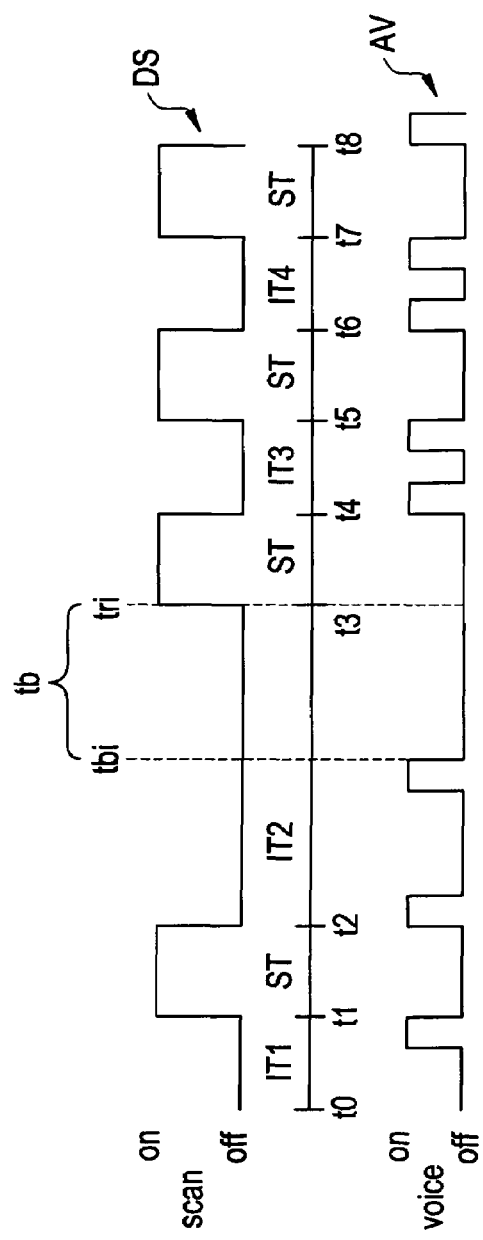

MAGNETIC RESONANCE IMAGING APPARATUS AND IMAGING APPARATUS

CROSS REFERENCE TO RELATED APPLICATIONS

This application claims the benefit of Japanese Application No. 2005-154323 filed May 26, 2005.

BACKGROUND OF THE INVENTION

The present invention relates to a magnetic resonance imaging apparatus and an imaging apparatus.

A magnetic resonance imaging (MRI) apparatus and other imaging apparatuses that visualize the inside of a subject or an object are utilized in various fields for medical and industrial purposes.

The magnetic resonance imaging apparatus that is one of the imaging apparatuses irradiates electromagnetic waves to a subject lying down in a static magnetic field space, and scans the subject so as to excite the subject's spins through nuclear magnetic resonance (NMR). Images expressing subject's slices, that is, subject's sections are produced based on magnetic resonance (MR) signals induced by the spins excited due to the scanning.

In the magnetic resonance imaging apparatus, a dynamic scanning technique of sequentially performing a plurality of scans with a time interval between adjoining scans is implemented (refer to, for example, Patent Document 1).

Japanese Unexamined Patent Publication No. 2002-165775

In the dynamic scanning, for example, a subject is asked to enter a non-breathing state at intervals, and timings of performing respective scans are designated in advance so that each scan will be performed in the non-breathing state. In the dynamic scanning, scans are performed in the non-breathing state according to the timings designated in advance. Consequently, the dynamic scanning is widely adopted because deterioration in image quality derived from respiratory body motion can be prevented.

However, when the dynamic scanning is implemented, if a subject cannot enter or retain the non-breathing state, the timings of performing respective scans designated in advance may be inconsistent with the timings when the subject enters the non-breathing state. In this case, low-quality images are produced. Scans may have to be performed again. This may lead to degradations in imaging efficiency and maneuverability alike.

In particular, when the dynamic scanning is implemented with a contrast medium injected into a subject, since there is often difficulty in re-injecting the contrast medium into the subject, the drawback that the imaging efficiency and maneuverability degrade may become obvious.

SUMMARY OF THE INVENTION

Therefore, an object of the present invention is to provide a magnetic resonance imaging apparatus and an imaging apparatus of which imaging efficiencies and maneuverabilities can be improved.

In efforts to accomplish the above object, a magnetic resonance imaging apparatus in accordance with the present invention irradiates electromagnetic waves to a subject lying down in a static magnetic field space, scans the subject so as to acquire magnetic resonance signals induced by the subject, and produces images of the subject on the basis of the magnetic resonance signals resulting from the scanning. The magnetic resonance imaging apparatus includes: a dynamic scanning initiating means for initiating dynamic scanning in which a plurality of scans is sequentially performed with a time interval between adjoining scans; a dynamic scanning suspending means for suspending the dynamic scanning initiated by the dynamic scanning initiating means; and a dynamic scanning resuming means for resuming the dynamic scanning suspended by the dynamic scanning suspending means.

In efforts to accomplish the aforesaid object, an imaging apparatus in accordance with the present invention produces images of a subject on the basis of raw data items acquired by scanning the subject, and includes a dynamic scanning initiating means for initiating dynamic scanning in which a plurality of scans is sequentially performed with a time interval between adjoining scans; a dynamic scanning suspending means for suspending the dynamic scanning initiated by the dynamic scanning initiating means; and a dynamic scanning resuming means for resuming the dynamic scanning suspended by the dynamic scanning suspending means.

According to the present invention, there are provided a magnetic resonance imaging apparatus and an imaging apparatus of which imaging efficiencies and maneuverabilities can be improved.

Further objects and advantages of the present invention will be apparent from the following description of the preferred embodiments of the invention as illustrated in the accompanying drawings.

BRIEF DESCRIPTION OF THE DRAWINGS

FIG. 3 is a flowchart describing actions to be performed in order to image the slices of a subject SU according to the first embodiment of the present invention.

FIG. 5 is a functional block diagram showing the configuration of a control unit 25 included in a magnetic resonance imaging apparatus 1 in accordance with the second embodiment of the present invention.

FIGS. 10a and 10b illustrate timing charts indicating timings of scans S to be performed in order to image the slices of the subject SU according to the third embodiment of the present invention, and indicating whether instructions are given to the subject by voice V in relation to the respective scans S (on or off).

DETAILED DESCRIPTION OF THE INVENTION

Embodiments of the present invention will be described below with reference to drawings.

First Embodiment

Figure 1:
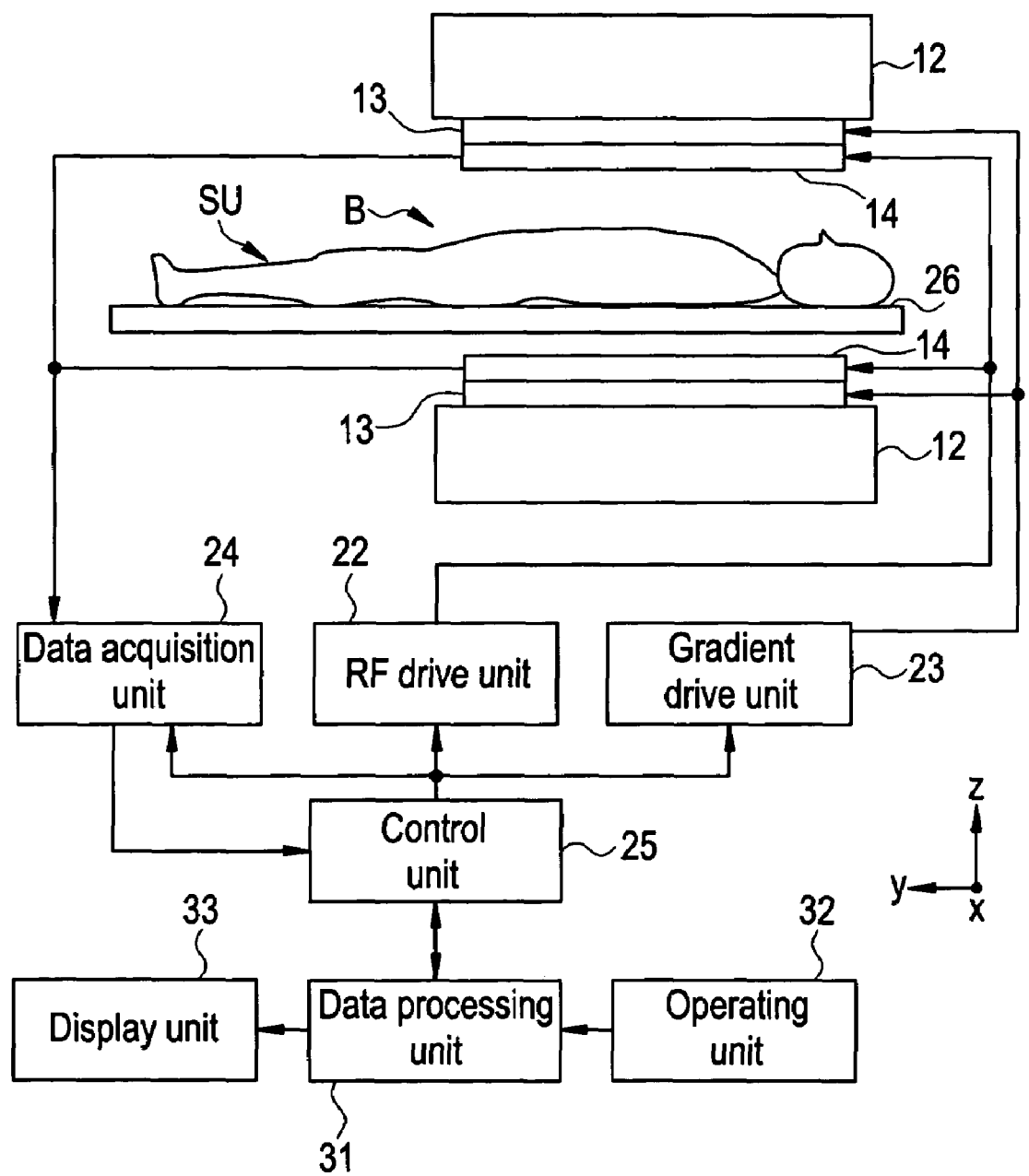
FIG. 1 shows the configuration of a magnetic resonance imaging apparatus 1 in accordance with the first embodiment of the present invention.

FIG. 1 shows the configuration of a magnetic resonance imaging apparatus 1 in accordance with the first embodiment.

As shown in FIG. 1, the magnetic resonance imaging apparatus 1 includes a static magnetic field magnet unit 12, a gradient coil unit 13, an radiofrequency (RF) coil unit 14, an RF drive unit 22, a gradient drive unit 23, a data acquisition unit 24, a control unit 25, a cradle 26, a data processing unit 31, an operating unit 32, and a display unit 33. Electromagnetic waves are irradiated to a subject SU lying down in an imaging space B, and the subject is scanned in order to acquire magnetic resonance signals induced by the subject SU. Images of the subject SU are produced based on the magnetic resonance signals resulting from the scanning.

The components of the magnetic resonance imaging apparatus 1 in accordance with the present embodiment will be sequentially described below.

The static magnetic field magnet unit 12 includes, for example, a pair of permanent magnets, and generates a static magnetic field in the imaging space B into which the subject SU is carried. Herein, the static magnetic field magnet unit 12 generates a static magnetic field so that the direction of the static magnetic field will be consistent with a vertical direction z in which the paired permanent magnets are opposed to each other. The static magnetic field magnet unit 12 may include a superconducting magnet.

The gradient coil unit 13 is, as shown in FIG. 1, disposed in the imaging space B to surround a scan field of the subject SU. The gradient coil unit 13 produces magnetic field gradients in the imaging space B in which a static magnetic field is generated, and appends positional information to a magnetic resonance signal to be received by the RF coil unit 14. Herein, the gradient coil unit 13 includes three gradient coils, and produces magnetic field gradients in a frequency encoding direction, a phase encoding direction, and a slice selecting direction respectively according to scanning conditions. Specifically, the gradient coil unit 13 applies a magnetic field gradient in the slice selecting direction of the subject SU so as to select a slice, that is, a section of the subject SU that is excited with RF pulses sent from the RF coil unit 14. Moreover, the gradient coil unit 13 applies a magnetic field gradient in the phase encoding direction of the subject SU so as to encode the phase of a magnetic resonance signal induced by the slice excited with the RF pulses. The gradient coil unit 13 applies a magnetic field gradient in the frequency encoding direction of the subject SU so as to encode the frequency of a magnetic resonance signal induced by the slice excited with the RF pulses.

The RF coil unit 14 is, as shown in FIG. 1, disposed in the imaging space B to surround a scan field of the subject SU. The RF coil unit 14 transmits RF pulses associated with electromagnetic waves to the subject SU lying down in the imaging space B in which the static magnetic field magnet unit 12 generates a static magnetic field, whereby an RF magnetic field is produced in order to excite the spins of protons in the scan field of the subject. The RF coil unit 14 receives as a magnetic resonance signal electromagnetic waves induced by the excited protons in the subject SU.

The RF drive unit 22 drives the RF coil unit 14 and causes the RF coil unit 14 to transmit RF pulses to the imaging space B so as to produce an RF magnetic field. In response to a control signal sent from the control unit 25, the RF drive unit 22 uses a gate modulator to modulate a signal sent from an RF oscillator into a signal having a predetermined timing and a predetermined envelope. Thereafter, an RF power amplifier amplifies the signal modulated by the gate modulator, and transmits the resultant signal to the RF coil unit 14 so that the RF coil unit will transmit RF pulses.

In response to a control signal sent from the control unit 25, the gradient drive unit 23 applies gradient pulses to the gradient coil unit 13 so as to drive the gradient coil unit 13. This causes the gradient coil unit 13 to produce magnetic field gradients in the imaging space B in which a static magnetic field is generated. The gradient drive unit 23 includes three drive circuits (not shown) in association with the three gradient coils included in the gradient coil unit 13.

In response to a control signal sent from the control unit 25, the data acquisition unit 24 acquires a magnetic resonance signal received by the RF coil unit 14, and transmits the signal to the data processing unit 31. The data acquisition unit 24 acquires a magnetic resonance signal, which has undergone both phase encoding and frequency encoding, so that the magnetic resonance signal can be defined in a k space. Herein, the data acquisition unit 24 uses a phase detector to detect the phase of the magnetic resonance signal received by the RF coil unit 14 by regarding an output of the RF oscillator included in the RF drive unit 22 as a reference signal. Thereafter, the data acquisition unit 24 uses an A/D converter to convert the magnetic resonance signal from an analog form to a digital form. The data acquisition unit 24 stores the magnetic resonance signal in a memory, and then transmits the magnetic resonance signal to the data processing unit 31.

The control unit 25 includes a computer and programs based on which the computer causes the components of the apparatus to perform actions associated with predetermined scanning. The control unit 25 transmits a control signal, which instructs implementation of the predetermined scanning, to each of the RF drive unit 22, gradient drive unit 23, and data acquisition unit 24 according to an operational signal transferred from the operating unit 32 via the data processing unit 31, and thus controls the RF drive unit 22, gradient drive unit 23, and data acquisition unit 24.

Figure 2:
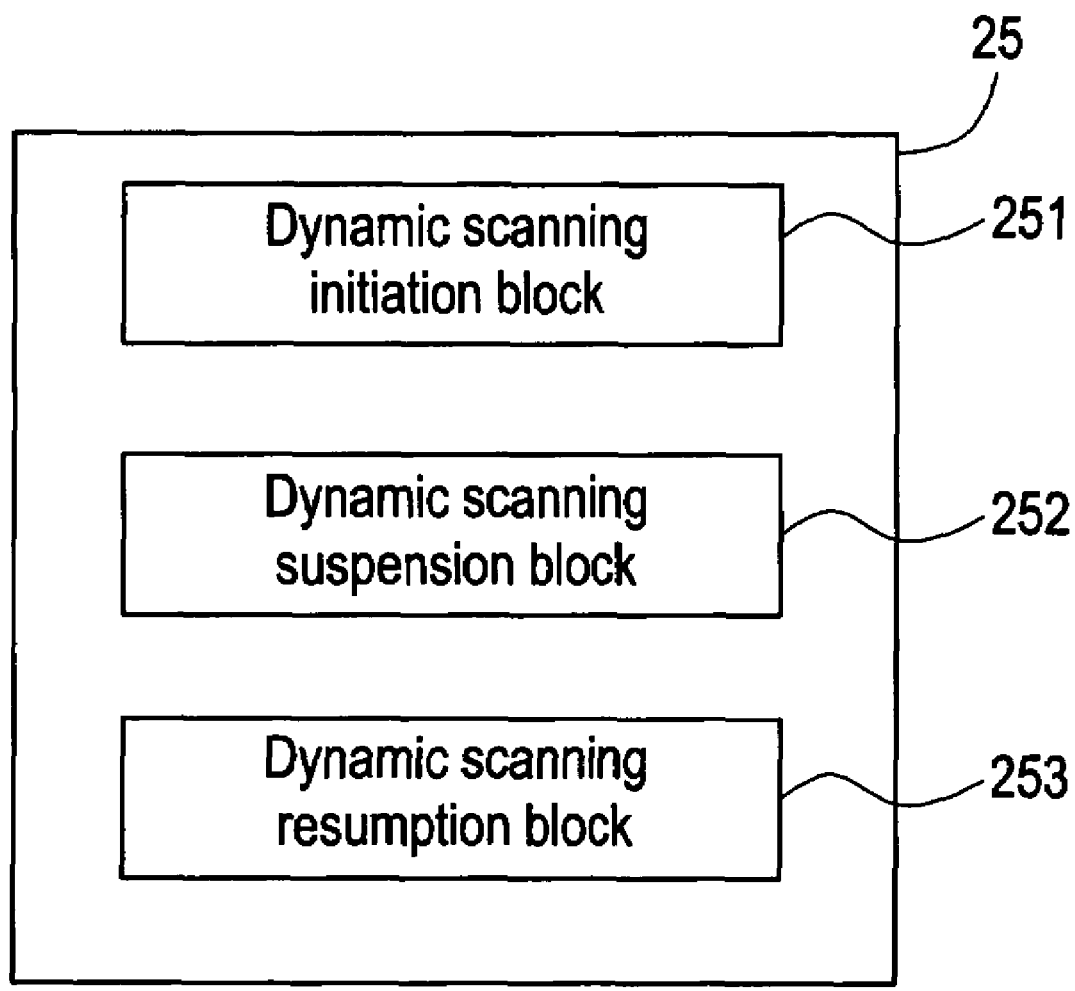
FIG. 2 is a functional block diagram showing the configuration of a control unit 25 included in the magnetic resonance imaging apparatus 1 in accordance with the first embodiment of the present invention.

FIG. 2 is a functional block diagram showing the configuration of the control unit 25 included in the magnetic resonance imaging apparatus 1 in accordance with the first embodiment of the present invention.

As shown in FIG. 2, the control unit 25 includes a dynamic scanning initiation block 251, a dynamic scanning suspension block 252, and a dynamic scanning resumption block 253.

The dynamic scanning initiation block 251 initiates dynamic scanning in which a plurality of scans is sequentially performed with a time interval between adjoining scans. Herein, in response to an initiation command which an operator enters at the operating unit 32 so as to initiate the dynamic scanning, the dynamic scanning initiation block 251 initiates the dynamic scanning. The dynamic scanning is then implemented to meet scanning conditions which the data processing unit 31 designates in response to a command which the operator enters at the operating unit 3. Specifically, the dynamic scanning initiation block 251 transmits a control signal to each of the RF drive unit 22, gradient drive unit 23, and data acquisition unit 24 so that a plurality of scans will be performed at predetermined timings during implementation of the dynamic scanning, and thus controls the RF drive unit 22, gradient drive unit 23, and data acquisition unit 24.

The dynamic scanning suspension block 252 suspends the dynamic scanning initiated by the dynamic scanning initiation block 251. The dynamic scanning suspension block 252 suspends the dynamic scanning initiated by the dynamic scanning initiation block 251 in response to a suspension command which an operator enters at the operating unit 32 so as to suspend the dynamic scanning. Specifically, the dynamic scanning suspension block 252 transmits a control signal to each of the RF drive unit 22, gradient drive unit 23, and data acquisition unit 24 so as to halt the units at the timing when the suspension command with which the dynamic scanning is suspended is entered. Herein, when the subject SU is scanned according to the dynamic scanning, if the suspension command with which the dynamic scanning is suspended is received, the dynamic scanning suspension block 252 measures a time and controls the units so that the dynamic scanning will be suspended after the completion of a scan that is under way at the time of entry of the suspension command.

The dynamic scan resumption block 253 resumes the dynamic scanning suspended by the dynamic scanning suspension block 252. Herein, the dynamic scanning resumption block 253 resumes the dynamic scanning suspended by the dynamic scanning suspension block 252 in response to a resumption command which an operator enters at the operating unit 32 so as to resume the dynamic scanning. The dynamic scanning is resumed to meet the scanning conditions for the dynamic scanning which the data processing unit 31 has designated based on the command entered at the operating unit 32 by the operator.

The cradle 26 has a board on which the subject SU lies down. The cradle 26 moves into or out of the imaging space B according to a control signal sent from the control unit 25.

The data processing unit 31 includes a computer and a program based on which the computer executes predetermined data processing. The data processing unit 31 is connected to the operating unit 32, and receives an operational signal sent from the operating unit 32. The data processing unit 31 is connected to the control unit 25, and transmits the operational signal, which an operator enters at the operating unit 32, to the control unit 25. Moreover, the data processing unit is connected to the data acquisition unit 24, acquires a magnetic resonance signal acquired by the data acquisition unit 24, and performs image processing on the acquired magnetic resonance signal so as to produce an image of a slice that is a section of the subject SU. For example, the data processing unit 31 performs Fourier transform on the digitized magnetic resonance signal so as to produce the image of the subject SU. The data processing unit 31 transmits the produced image to the display unit 33.

The operating unit 32 is realized with an operating device including a keyboard and a mouse. The operating unit 32 is manipulated by an operator, and transmits an operational signal, which is produced responsively to the manipulation, to the data processing unit 31. Herein, the operating unit 32 is designed so that the operator can select a pulse sequence, which is suitable for a purpose of imaging and according to which a scan is performed, from among a plurality of pulse sequences, and designate the scan.

The display unit 33 is realized with a display device such as a CRT. Images expressing the slices of the subject SU produced based on magnetic resonance signals induced by the subject SU are displayed on the display unit 33.

A description will be made of actions to be performed when slices of the subject SU are imaged using the magnetic resonance imaging apparatus 1 in accordance with the embodiment.

FIG. 3 and FIG. 4 are explanatory diagrams concerning actions to be performed in order to image the slices of the subject SU according to the present embodiment.

Herein, FIG. 3 is a flowchart describing actions to be performed in order to image the slices of the subject SU according to the present embodiment.

FIG. 4 includes timing charts indicating timings of scans S to be performed in order to image the slices of the subject SU. The axis of abscissas reads a time t, and the axis of ordinates reads whether the scans S are performed or not (on or off). Referring to FIG. 4, FIG. 4(a) is a timing chart indicating the timings of the scans S to be performed for implementation of the dynamic scanning DS designated prior to the initiation of the scanning. FIG. 4(b) and FIG. 4(c) are timing charts indicating timings of the scans S to be performed for implementation of the dynamic scanning DS in case a scan is suspended after initiation of the scanning and then resumed.

When the slice, that is, sections of the subject SU are imaged, the subject SU is asked to lie down on the cradle 26. The control unit 25 controls the cradle 26 on which the subject SU lies down so as to move the cradle into the imaging space B in which a static magnetic field is generated.

Thereafter, as described in FIG. 3, the scanning conditions for the dynamic scanning DS are designated (S11).

Herein, the data processing unit 31 designates the scanning conditions according to scanning conditions which an operator enters at the operating unit 32.

Figure 4A:
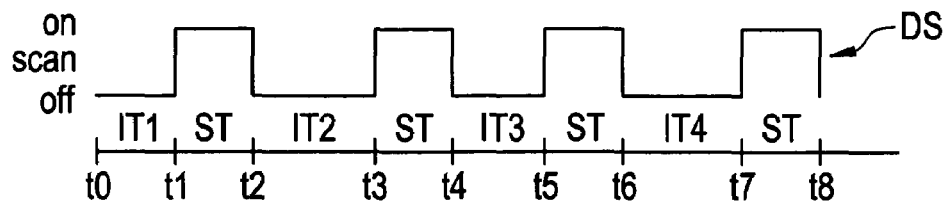
FIGS. 4a, 4b, 4c, and 4d illustrate timing charts indicating timings of scans S to be performed in order to image the slices of the subject SU according to the first embodiment of the present invention.
Figure 4B:
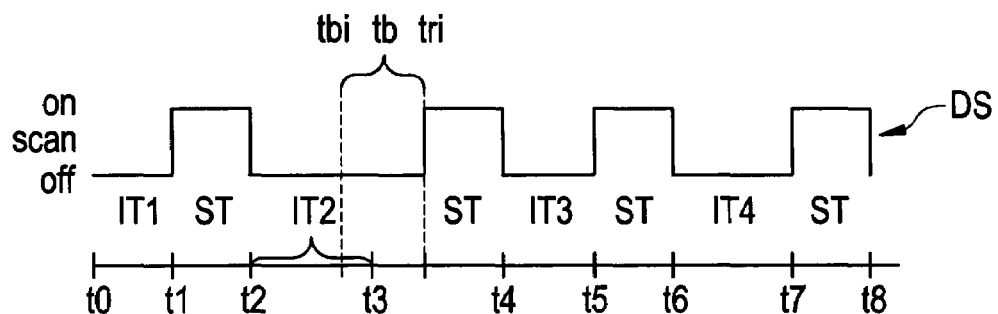
Figure 4C:
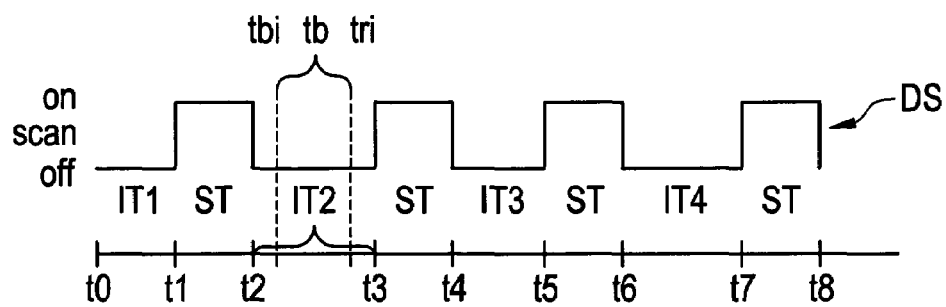
Figure 4D:
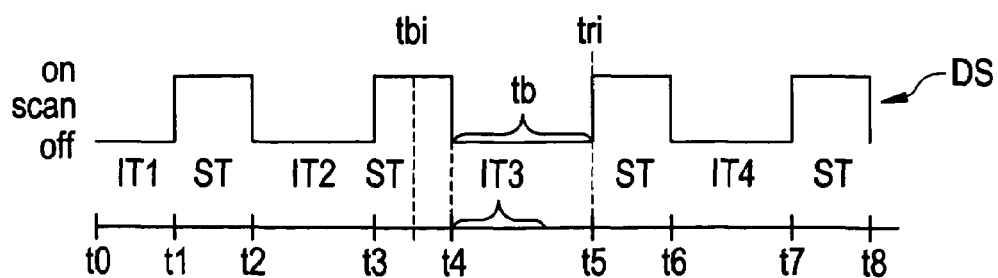

According to the present embodiment, as shown in FIG. 4(a), the scanning conditions for the dynamic scanning DS are designated so that a plurality of scans S will be sequentially performed with a time interval between adjoining scans. Namely, the scanning conditions for the dynamic scanning DS are designated so that interval times IT1, IT2, IT3, and IT4 during which no scan S is performed and scan times ST during which the respective scans S are performed will come alternately. For example, the scanning conditions for the dynamic scanning are designated so that a scan S whose scan time ST is 10 sec will be repeated four times alternately with each of the interval times IT1, IT2, IT3, and IT4 that are different from one another. Specifically, no scan S is performed during a period from a time instant t0 at which dynamic scanning is initiated to the first time instant t1 at which the interval time IT of 10 sec long has elapsed. A scan S is performed during a period from the first time instant t1 to the second time instant t2 at which the scan time ST of 10 sec long has elapsed. No scan S is performed during a period from the second time instant t2 to the third time instant t3 at which the interval time IT2 of 20 sec long has elapsed. A scan S is performed during a period from the third time instant t3 to the fourth time instant t4 at which the scan time ST of 10 sec long has elapsed. Thus, the interval times IT1, IT2, IT3, and IT4 and the scan times ST are designated by specifying time instants during the period of the dynamic scanning DS.

Thereafter, the dynamic scanning DS is initiated as described in FIG. 3 (S21).

Herein, the dynamic scanning initiation block 251 initiates the dynamic scanning DS in response to an initiation command which an operator enters at the operating unit 32 so as to initiate the dynamic scanning DS. The dynamic scanning is then implemented under the scanning conditions designated as mentioned above. Specifically, as shown in FIG. 4(*a*), no scan S is performed during the period from the time instant t0 at which the dynamic scanning is initiated to the first time instant t1 at which the interval time IT1 of ten sec long has elapsed. A scan S is performed during the period from the first time instant t1 to the second time instant t2 at which the scan time ST of ten sec long has elapsed. For example, the subject SU is scanned according to a spin echo imaging technique. The RF coil unit 14 receives magnetic resonance signals induced by the subject SU due to the scan S. The data processing unit 31 produces images expressing the slice of the subject SU according to the magnetic resonance signals received by the RF coil unit 14. The produced images are displayed on the display unit 33. While the dynamic scanning DS is under way, the subject SU is asked to hold his/her breath during the scan time ST and to breathe during the interval times IT1, IT2, IT3, and IT4. The operator monitors the respiratory condition of the subject SU.

Thereafter, as described in FIG. 3, a determination is made of whether the dynamic scanning DS should be suspended (Y) or not (N) (S31).

Herein, while the dynamic scanning DS is under way, an operator monitors the respiratory condition of the subject SU and determines whether the dynamic scanning DS should be suspended.

As described in FIG. 3, if the dynamic scanning DS is not suspended (N), the dynamic scanning is kept on.

On the other hand, if the dynamic scanning DS is suspended (Y), an operator enters a suspension command, with which the dynamic scanning DS is suspended, at the operating unit 34. If the subject SU is not regarded to be able to hold his/her breath at the timing of the scan time ST, the suspension command with which the dynamic scanning DS is suspended is entered at the operating unit 32.

Thereafter, the dynamic scanning DS is suspended (S41).

Herein, in response to the suspension command which an operator enters at the operating unit 32 so as to suspend the dynamic scanning DS, the dynamic scanning suspension block 252 suspends the dynamic scanning DS initiated by the dynamic scanning initiation block 251.

To be more specific, for example, assume that an operator enters a suspension command, with which the dynamic scanning DS is suspended, at the operating unit 31 during the interval time IT2 from the second time instant t2 to the third time instant t3. In this case, as shown in FIG. 4(*b*) and FIG. 4(*c*), the dynamic scanning suspension block 252 suspends the dynamic scanning DS at the suspension command entry time instant tbi at which the operator enters the suspension command at the operating unit 32.

For example, assume that an operator enters a suspension command, with which the dynamic scanning DS is suspended, at the operating unit 32 during the scan time ST from the third time instant t3 to the fourth time instant t4. As shown in FIG. 4(*d*), the dynamic scanning suspension block 252 suspends the dynamic scanning DS at the fourth time instant t4 at which a scan S that is under way at a suspension command entry time instant tbi at which the operator enters the suspension command at the operating unit 32 is completed.

Thereafter, as described in FIG. 3, a determination is made of whether the dynamic scanning DS should be resumed (Y) or not (N) (S51).

Herein, when the dynamic scanning DS is suspended, an operator monitors the respiratory condition of the subject SU so as to determine whether the dynamic scanning DS should be resumed.

As described in FIG. 3, if the dynamic scanning DS is not resumed (N), a determination is made of whether the dynamic scanning DS should be terminated (Y) or not (N) (S71). If the dynamic scanning DS is terminated (Y), a command with which the dynamic scanning DS is terminated is entered at the operating unit 32. Consequently, the dynamic scanning DS is terminated while being suspended.

On the other hand, if the dynamic scanning DS is resumed at step S51 (Y), or if the dynamic scanning DS is not terminated but resumed at step S71 (N), an operator enters a resumption command, with which the dynamic scanning DS is resumed, at the operating unit 32. For example, if the subject SU is recognized to be able to hold his/her breath at the timing of the scan time ST, the resumption command with which the dynamic scanning DS is resumed is entered at the operating unit 32.

Thereafter, the dynamic scanning DS is resumed (S61).

Herein, in response to the resumption command which an operator enters at the operating unit 32 so as to resume the dynamic scanning DS, the dynamic scanning resumption block 253 resumes the dynamic scanning DS suspended by the dynamic scanning suspension block 252.

Specifically, as shown in FIG. 4(*b*), FIG. 4(*c*), and FIG. 4(*d*), when a suspension time tb has elapsed since a time instant tbi at which the dynamic scanning DS is suspended, if an operator enters a resumption command, with which the dynamic scanning DS is resumed, at the operating unit 32, the dynamic scanning resumption block 253 resumes the dynamic scanning DS at a resumption command entry time instant tri at which the operator enters the resumption command at the operating unit 32. The RF coil unit 14 receives magnetic resonance signals induced by the subject SU due to the scan S. The data processing unit 31 successively produces images expressing the slice of the subject SU according to the magnetic resonance signals received by the RF coil unit 14. The images are then displayed on the display unit 33. Steps S31 and successive steps are, as described in FIG. 3, repeated, and the dynamic scanning DS is terminated.

Specifically, as shown in FIG. 4(*b*), when the dynamic scanning is suspended during the interval time T12, if an operator enters a resumption command, with which the dynamic scanning DS is resumed, at the operating unit 32 after the elapse of the interval time IT2, the dynamic scanning DS is resumed so that a scan S will be performed at the resumption command entry time instant tri. Moreover, as shown in FIG. 4(*c*), when the dynamic scanning DS is suspended during the interval time IT2, if the operator enters the resumption command, with which the dynamic scanning DS is resumed, at the operating unit 32 before the elapse of the interval time IT2, a time is measured and the dynamic scanning DS is resumed so that a scan S will be performed after the elapse of the interval time IT2 which includes the resumption command entry time instant tri. As shown in FIG. 4(*d*), when the dynamic scanning DS is suspended during the scan time ST, if the operator enters a resumption command, with which the dynamic scanning DS is resumed, at the operating unit 32 after the elapse of the interval time IT3 succeeding a scan, the dynamic scanning DS is resumed so that another scan S will be performed at the resumption command entry time instant tri.

As mentioned above, according to the present embodiment, the dynamic scanning initiation block 251 initiates the dynamic scanning DS in which a plurality of scans S is sequentially performed with a time interval between adjoining scans. In response to a suspension command which an operator enters so as to suspend the dynamic scanning DS, the dynamic scanning suspension block 252 suspends the dynamic scanning DS initiated by the dynamic scanning initiation block 251. In response to a resumption command which the operator enters so as to resume the dynamic scanning, the dynamic scanning resumption block 253 resumes the dynamic scanning DS suspended by the dynamic scanning suspension block 252. When the subject SU is scanned according to the dynamic scanning DS, if the dynamic scanning suspension block 252 receives the suspension command, the dynamic scanning suspension block 252 suspends the dynamic scanning DS after completion of the scan performed on the subject. According to the present invention, when the dynamic scanning DS is implemented, if the timing of a scan S designated in advance and the timing of a non-breathing state become inconsistent with each other, that is, if the subject SU cannot enter or retain the non-breathing state, the timing of the scan S can be changed to a desired timing. Consequently, the present embodiment can improve imaging efficiency and maneuverability.

Second Embodiment

A magnetic resonance imaging apparatus 1 in accordance with the second embodiment of the present invention will be described below.

FIG. 5 is a functional block diagram showing the configuration of a control unit 25 included in the magnetic resonance imaging apparatus 1 in accordance with the second embodiment of the present invention.

As shown in FIG. 5, the magnetic resonance imaging apparatus 1 in accordance with the present embodiment includes, unlike the magnetic resonance imaging apparatus in accordance with the first embodiment, a manual scan initiation block 254. Except this point, the present embodiment is identical to the first embodiment. An iterative description will be omitted.

The manual scanning initiation block 254 initiates manual scanning in response to an initiation command which an operator enters to initiate scanning. The manual scanning is implemented to meet scanning conditions which a data processing unit 31 determines for the manual scanning in response to the command which the operator enters at the operating unit 32. Specifically, after a dynamic scanning suspension block 252 suspends dynamic scanning, before a dynamic scanning resumption block 253 resumes the dynamic scanning, the manual scanning initiation block 254 initiates as the manual scanning a scan suspended by the dynamic scanning suspension block during implementation of the dynamic scanning.

A description will be made of actions to be performed in order to image slices, that is, sections of the subject SU using the magnetic resonance imaging apparatus 1 in accordance with the present embodiment.

Figure 6:
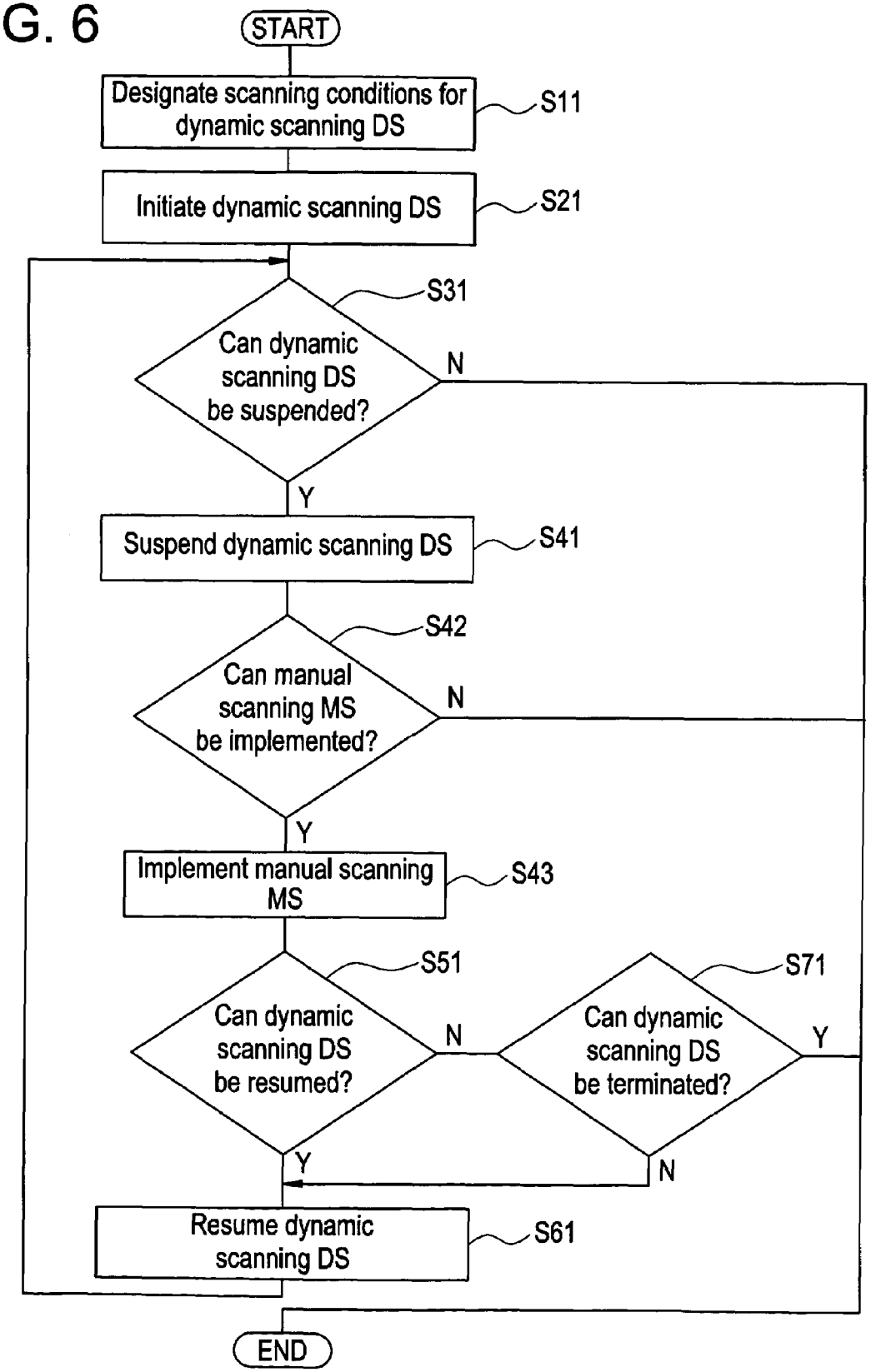
FIG. 6 is a flowchart describing actions to be performed in order to image the slices of a subject SU according to the second embodiment of the present invention.
Figure 7A:
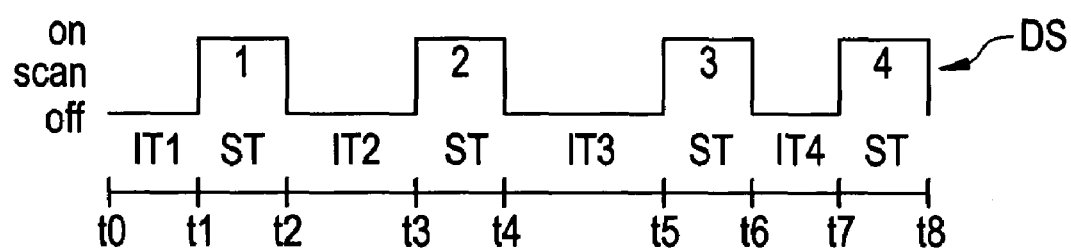
FIGS. 7a and 7b illustrate timing charts indicating timings of scans S to be performed in order to image the slices of the subject SU according to the second embodiment of the present invention.

FIG. 6 and FIG. 7 are explanatory diagrams concerning actions to be performed in order to image the slices of the subject SU according to the present embodiment.

FIG. 6 is a flowchart describing the actions to be performed in order to image the slices of the subject SU according to the present embodiment.

FIG. 7 includes timing charts indicating timings of scans S to be performed in order to image the slices of the subject SU according to the present embodiment. The axis of abscissas reads a time t, while the axis of ordinates reads whether the respective scans are performed (on) or not (off). Referring to FIG. 7, FIG. 7(*a*) is a timing chart indicating the timings of scans S to be performed for implementation of the dynamic scanning DS designated prior to initiation of the scanning. FIG. 7(*b*) is a timing chart indicating the timings of scans S to be performed for implementation of the dynamic scanning DS in case one of the scans is suspended after initiation of the dynamic scanning and then resumed as manual scanning MS.

As described in FIG. 6, first, scanning conditions for the dynamic scanning DS are designated (S11).

Herein, the data processing unit 31 designates the scanning conditions according to the scanning conditions which an operator enters at the operating unit 32. As shown in FIG. 7(*a*), similarly to the first embodiment, the scanning conditions for the dynamic scanning DS are designated so that a plurality of scans S will be sequentially performed with a time interval between adjoining scans.

As shown in FIG. 6, similarly to the first embodiment, the dynamic scanning DS is initiated (S21). A determination is then made of whether the dynamic scanning DS should be suspended (Y) or not (N) (S31). If the dynamic scanning DS is suspended (Y), an operator enters a suspension command, with which the dynamic scanning DS is suspended, at the operating unit 32 so as to suspend the dynamic scanning DS (S41).

Thereafter, as described in FIG. 6, a determination is made of whether the manual scanning MS should be implemented (Y) or not (N) (S42).

Herein, while the dynamic scanning DS is suspended, the operator monitors the respiratory condition of the subject SU and determines whether the manual scanning MS should be implemented.

As described in FIG. 6, if the manual scanning MS is not implemented (N), the dynamic scanning DS is terminated while being suspended.

On the other hand, if the manual scanning MS is implemented (Y), the operator enters an initiation command, with which the manual scanning MS is initiated, at the operating unit 32. For example, if the subject SU is recognized to breathe stably and to be able to hold his/her breath, an initiation command with which the manual scanning MS is initiated is entered (S43). In response to the initiation command which the operator has entered so as to initiate scanning, the manual scanning initiation block 254 initiates the manual scanning MS. After the dynamic scanning suspension block 252 suspends dynamic scanning, before the dynamic scanning resumption block 253 resumes the dynamic scanning, the manual scanning initiation block 254 initiates as the manual scanning a scan suspended by the dynamic scanning suspension block 252 during implementation of the dynamic scanning.

Specifically, as shown in FIG. 7(*b*), assume that an operator enters an initiation command, with which the manual scanning MS is resumed, at the operating unit 32 after a time instant tbi at which the dynamic scanning DS is suspended. In this case, after the dynamic scanning suspension block 252 suspends the dynamic scanning DS, the manual scanning initiation block 254 initiates as the manual scanning MS one of scans S scheduled to be performed. The RF coil unit 14 receives magnetic resonance signals induced by the subject SU during the scan S. The data processing unit 31 sequentially produces images expressing slices, that is, sections of the subject SU according to the magnetic resonance signals received by the RF coil unit 14. The images are displayed on the display unit 33.

Figure 7B:
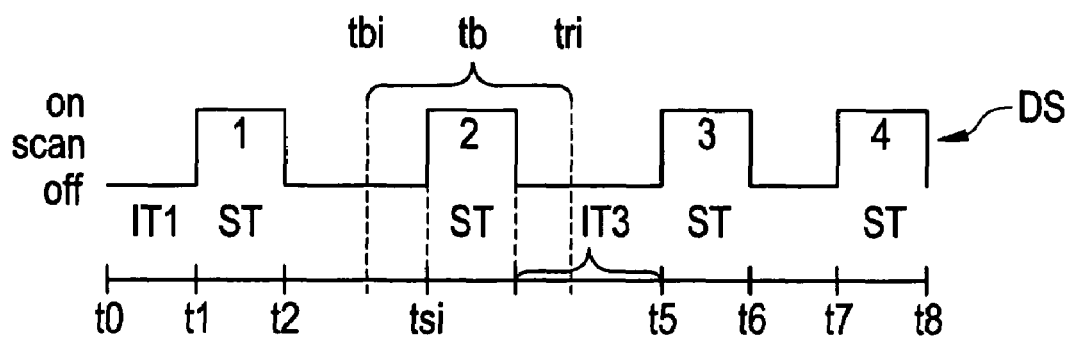

Thereafter, as described in FIG. 6, similarly to the first embodiment, a determination is made of whether the dynamic scanning DS should be resumed (Y) or not (N) (S51). As described in FIG. 6, if the dynamic scanning DS is not resumed (N), a determination is made of whether the dynamic scanning DS should be terminated (Y) or not (N) (S71). Herein, if the dynamic scanning DS is terminated (Y), a command with which the dynamic scanning DS is terminated is entered at the operating unit 32. The dynamic scanning DS is then terminated while being suspended. On the other hand, if the dynamic scanning DS is resumed (Y), the operator enters a resumption command, with which the dynamic scanning DS is resumed, at the operating unit 32. As shown in FIG. 7(b), similarly to the first embodiment, the dynamic scanning DS is resumed (S61). The RF coil unit 14 receives magnetic resonance signals induced by the subject SU due to the scan S. The data processing unit 31 sequentially produces images expressing the slices of the subject according to the magnetic resonance signals received by the Rf coil unit 14. The images are then displayed on the display unit 33.

As mentioned above, according to the present embodiment, after the dynamic scanning suspension block 252 suspends dynamic scanning, before the dynamic scanning resumption block 253 resumes the dynamic scanning, the manual scanning initiation block 254 initiates the manual scanning MS. According to the present embodiment, similarly to the first embodiment, when the dynamic scanning DS is implemented, if the timing of a scan S designated in advance and the timing of a non-breathing state become inconsistent with each other, the timing of the scan S can be changed to a desired timing. Consequently, the present embodiment can improve imaging efficiency and maneuverability.

Third Embodiment

A magnetic resonance imaging apparatus 1 in accordance with the third embodiment of the present invention will be described below.

Figure 8:
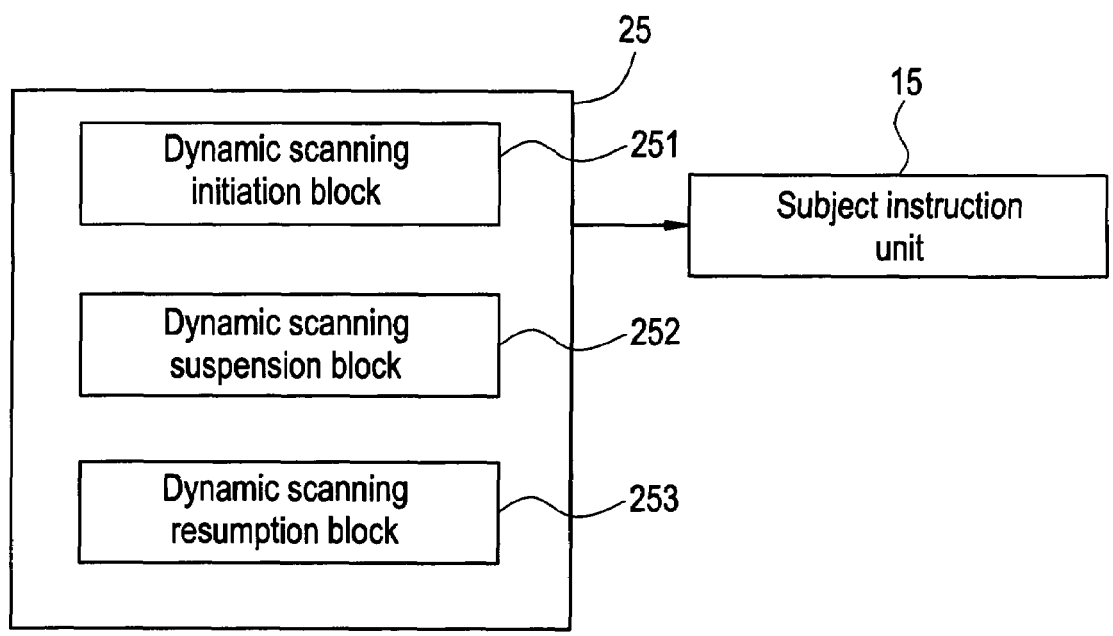
FIG. 8 is a functional block diagram showing the configuration of a major portion of a magnetic resonance imaging apparatus 1 in accordance with the third embodiment of the present invention.

FIG. 8 is a functional block diagram showing the configuration of a major portion of the magnetic resonance imaging apparatus 1 in accordance with the third embodiment of the present invention.

As shown in FIG. 8, the magnetic resonance imaging apparatus 1 in accordance with the third embodiment includes, unlike the magnetic resonance imaging apparatus 1 in accordance with the first embodiment, a subject instruction unit 15. Except this point, the present embodiment is identical to the first embodiment. An iterative description will be omitted.

The subject instruction unit 15 includes a loudspeaker that radiates voice and a memory in which audio data is stored. Prior to each of a plurality of scans to be performed for implementation of dynamic scanning, instructions are given to the subject SU by voice. Herein, the subject instruction unit 15 uses the audio data representing respiratory instructions to radiate voice from the loudspeaker so as to give instructions to the subject SU. According to the present embodiment, when the dynamic scanning resumption block 253 resumes dynamic scanning, the subject instruction unit 15 gives instructions to the subject SU so that the subject will get ready for a scan suspended by the dynamic scanning suspension block 252 during implementation of the dynamic scanning.

A description will be made of actions to be performed in order to image the slices, that is, sections of the subject SU using the magnetic resonance imaging apparatus 1 in accordance with the present embodiment.

Figure 9:
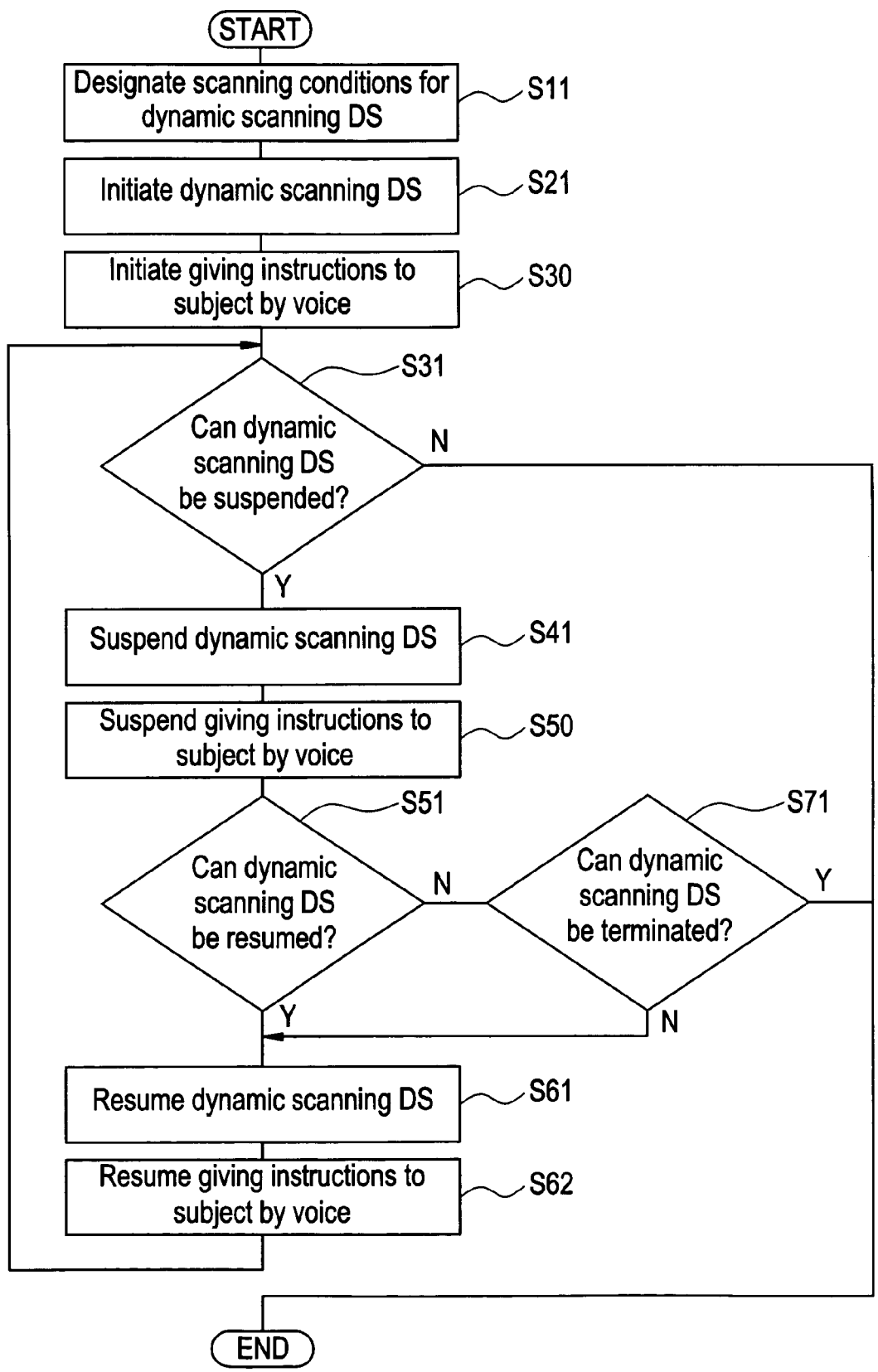
FIG. 9 is a flowchart describing actions to be performed in order to image the slices of a subject SU according to the third embodiment of the present invention.

FIG. 9 and FIG. 10 are explanatory diagrams concerning actions to be performed in order to image the slices of the subject SU according to the present embodiment.

FIG. 9 is a flowchart describing the actions to be performed in order to image the slices of the subject SU according to the present embodiment.

FIG. 10 includes timing charts indicating timings of scans S to be performed in order to image the slices of the subject SU, and indicating whether voice V by which instructions are given to the subject SU in relation to the scans S is radiated (on) or not (off). The axis of abscissas reads a time t, and the axis of ordinates reads whether the respective scans are performed or not or instructions are given by voice or not. FIG. 10(a) includes timing charts indicating the timings of scans S to be performed for implementation of the dynamic scanning DS designated prior to initialization of the scanning, and indicating whether voice V is radiated in order to give instructions to the subject SU in relation to the scans S (on or off). On the other hand, FIG. 10(b) includes timing charts indicating the timings of scans to be performed for implementation of the dynamic scanning DS in case a scan is suspended after initialization of the scanning and then resumed, and indicating whether voice V is radiated in order to give instructions to the subject SU in relation to the scans S (on or off).

As described in FIG. 9, the scanning conditions for the dynamic scanning DS are designated (S11).

Herein, a data processing unit 31 designates the scanning conditions according to the scanning conditions which an operator enters at an operating unit 32. As shown in FIG. 10(a), the scanning conditions for the dynamic scanning DS are designated in the same manner as they are according to the first embodiment, so that a plurality of scans S will be sequentially performed with a time interval between adjoining scans. Moreover, audio sequence data AV representing voice V that signifies instructions to be given to the subject SU is designated in relation to each of the scans. Specifically, the data processing unit 31 designates the audio sequence data AV so that instructions will be given to the subject SU by voice V before and after each of the scans S to be performed for implementation of the dynamic scanning DS. For example, the audio sequence data is designated so that: during four sec before the initialization of each of the scans S, voice V signifying that the subject should hold his/her breath will be radiated in order to given instructions to the subject SU; and during four sec after the completion of each of the scans, voice V signifying that the subject may breathe will be radiated in order to give instructions to the subject SU.

Thereafter, as described in FIG. 9, the dynamic scanning DS is initialized in the same manner as it is according to the first embodiment (S21).

Thereafter, as described in FIG. 9, giving instructions to the subject SU by voice is initialized (S30).

Herein, the subject instruction unit 15 receives a control signal which a dynamic scanning initialization block 251 transmits to each of the units in order to implement dynamic scanning. Before and after each of the scans S is performed for implementation of the dynamic scanning DS, the subject instruction unit 15 gives instructions to the subject SU by voice. As mentioned above, the subject instruction unit 15 gives instructions to the subject SU by radiating voice from the loudspeaker according to audio data representing respiratory instructions.

To be more specific, as shown in FIG. 10(*a*), before a scan S is performed during a period from a first time instant t1 to a second time instant t2 at which a scan time ST has elapsed, instructions are given to the subject SU by voice during a period from a dynamic scanning initialization time instant t0 to the first time instant t1 at which an interval time IT has elapsed. For example, during four sec before initialization of the scan S, the subject SU is instructed by voice V to hold his/her breath. After the completion of the scan S performed during the period from the first time instant t1 to the second time instant t2 at which the scan time ST has elapsed, instructions are given to the subject SU by voice. For example, during four sec after completion of the scan S, the subject SU is instructed by voice V to now breathe.

Thereafter, as described in FIG. 9, a determination is made of whether the dynamic scanning DS should be suspended (Y) or not (N) (S31). If the dynamic scanning DS is suspended (Y), an operator enters a suspension command, with which the dynamic scanning DS is suspended, at the operating unit 32 so as to suspend the dynamic scanning DS (S41).

For example, as shown in FIG. 10(*b*), during an interval time IT2 from the second time instant t2 to a third time instant t3, instructions are given to the subject SU by voice prior to a scan S that will be performed during a scan time ST from the third time instant t3 to a fourth time instant t4. At this time, an operator enters a suspension command, with which the dynamic scanning DS is suspended, at the operating unit 32. The dynamic scanning suspension block 252 suspends the dynamic scanning DS at the suspension command entry time instant tbi at which the operator enters the suspension command at the operating unit 32.

Giving instructions to the subject SU by voice is then suspended (S50).

Herein, the subject instruction unit 15 receives a control signal which the dynamic scanning suspension block 252 transmits to each of the units so as to suspend the dynamic scanning DS, and suspends validation of audio sequence data AV designated as mentioned above.

Thereafter, as described in FIG. 9, a determination is, similarly to that in the first embodiment, made of whether the dynamic scanning D should be resumed (Y) or not (N) (S51). If the dynamic scanning DS is not resumed (N), a determination is made of whether the dynamic scanning DS should be terminated (Y) or not (N) (S71). If the dynamic scanning DS is terminated (Y), a command with which the dynamic scanning DS is terminated is entered at the operating unit 32. The dynamic scanning DS is then terminated while being suspended. On the other hand, if the dynamic scanning DS is resumed (Y), an operator enters a resumption command, with which the dynamic scanning DS is resumed, at the operating unit 32. The dynamic scanning DS is then resumed (S61). Giving instructions to the subject SU by voice is then resumed (S62).

Herein, scans S are sequentially performed for implementation of the dynamic scanning DS in the same manner as they are according to the first embodiment. The RF coil unit 14 receives magnetic resonance signals induced by the subject SU due to each of the scans S. The data processing unit 31 sequentially produces images expressing the slices of the subject SU according to the magnetic resonance signals. The images are then displayed on the display unit 33.

As mentioned above, according to the present embodiment, when the subject instruction unit 15 gives instructions to the subject SU prior to each of scans S to be performed for implementation of the dynamic scanning DS, the dynamic scanning DS may be suspended. Moreover, when the dynamic scanning resumption block 253 resumes the dynamic scanning DS, the subject instruction unit 15 gives instructions to the subject SU by voice so that the subject will get ready for a scan suspended by the dynamic scanning suspension block 252 during implementation of the dynamic scanning DS. Consequently, according to the present embodiment, similarly to the first embodiment, when the dynamic scanning DS is implemented, if the timing of a scan S designated in advance and the timing of a non-breathing state become inconsistent with each other, the timing of the scan can be changed to a desired timing. Thus, the present embodiment can improve imaging efficiency and maneuverability.

The magnetic resonance imaging apparatus 1 in accordance with any of the aforesaid embodiments is equivalent to a magnetic resonance imaging apparatus and an imaging apparatus in accordance with the present invention. Moreover, the subject instruction unit 15 included in the foregoing embodiment is equivalent to a subject instructing means included in the present invention. The dynamic scanning initiation block 251 included in the aforesaid embodiments is equivalent to a dynamic scanning initiating means included in the present invention. The dynamic scanning suspension block 252 included in the aforesaid embodiments is equivalent to a dynamic scanning suspending means included in the present invention. The dynamic scanning resumption block 253 included in the aforesaid embodiments is equivalent to a dynamic scanning resuming means included in the present invention. The manual scanning initiation block 254 included in the aforesaid embodiment is equivalent to a manual scanning initiating means included in the present invention.

Modes in which the present invention is implemented are not limited to the aforesaid embodiments, but various variants may be adopted.

For example, the aforesaid embodiments are concerned with the magnetic resonance imaging apparatus 1 but are not limited thereto. For example, the present invention can be applied to an X-ray CT apparatus or any other imaging apparatus that produces images of a subject SU according to raw data items acquired by scanning the subject SU.

Many widely different embodiments of the invention may be configured without departing from the spirit and the scope of the present invention. It should be understood that the present invention is not limited to the specific embodiments described in the specification, except as defined in the appended claims.

The invention claimed is:

1. A magnetic resonance imaging apparatus that irradiates electromagnetic waves to a subject lying down in a static magnetic field space, scans the subject so as to acquire magnetic resonance signals induced by the subject, and produces images of the subject according to the magnetic resonance signals acquired during the scanning, said magnetic resonance imaging apparatus comprising:

a dynamic scanning initiating device for initiating dynamic scanning in which a plurality of scans is sequentially performed with a time interval between sequential scans;

a dynamic scanning suspending device for suspending the dynamic scanning initiated by the dynamic scanning initiating device;

a dynamic scanning resuming device for resuming the dynamic scanning suspended by the dynamic scanning suspending device; and a manual scanning initiating device for initiating manual scanning while the dynamic scanning is suspended.

2. The magnetic resonance imaging apparatus according to claim 1, wherein the dynamic scanning suspending device suspends the dynamic scanning initiated by the dynamic scanning initiating device in response to a suspension command which an operator enters so as to suspend the dynamic scanning.

3. The magnetic resonance imaging apparatus according to claim 2, wherein when the subject is scanned according to the dynamic scanning, if the dynamic scanning suspending device receives the suspension command, the dynamic scanning suspending device suspends the dynamic scanning after completion of the scan performed on the subject.

4. The magnetic resonance imaging apparatus according to claim 1, wherein the dynamic scanning resuming device resumes the dynamic scanning suspended by the dynamic scanning suspending device in response to a resumption command which an operator enters so as to resume the dynamic scanning.

5. The magnetic resonance imaging apparatus according to claim 1, wherein, after the dynamic scanning suspending device suspends the dynamic scanning, and before the dynamic scanning resuming device resumes the dynamic scanning, the manual scanning initiating device initiates as the manual scanning a scan suspended by the dynamic scanning suspending device during implementation of the dynamic scanning.

6. The magnetic resonance imaging apparatus according to claim 1, further comprising a subject instructing device for giving instructions to the subject prior to each of the plurality of scans to be performed for implementation of the dynamic scanning.

7. The magnetic resonance imaging apparatus according to claim 6, wherein the subject instructing device gives instructions to the subject by voice.

8. The magnetic resonance imaging apparatus according to claim 6, wherein the subject instructing device gives respiratory instructions to the subject.

9. The magnetic resonance imaging apparatus according to claim 6, wherein when the dynamic scanning resuming device resumes the dynamic scanning, the subject instructing device gives instructions to the subject so that the subject will get ready for a scan suspended by the dynamic scanning suspending device during implementation of the dynamic scanning.

10. An imaging apparatus that produces images of a subject according to raw data items acquired by scanning the subject, said imaging apparatus comprising:

a dynamic scanning initiating device for initiating dynamic scanning in which a plurality of scans is sequentially performed with a time interval between sequential scans;

a dynamic scanning suspending device for suspending the dynamic scanning initiated by the dynamic scanning initiating device;

a dynamic scanning resuming device for resuming the dynamic scanning suspended by the dynamic scanning suspending device; and a manual scanning initiating device for initiating manual scanning while the dynamic scanning is suspended.

11. The imaging apparatus according to claim 10, wherein the dynamic scanning suspending device suspends the dynamic scanning initiated by the dynamic scanning initiating device in response to a suspension command which an operator enters so as to suspend the dynamic scanning.

12. The imaging apparatus according to claim 11, wherein when the subject is scanned according to the dynamic scanning, if the dynamic scanning suspending device receives the suspension command, the dynamic scanning suspending device suspends the dynamic scanning after completion of the scan performed on the subject.

13. The imaging apparatus according to claim 10, wherein the dynamic scanning resuming device resumes the dynamic scanning suspended by the dynamic scanning suspending device in response to a resumption command which an operator enters so as to resume the dynamic scanning.

14. The imaging apparatus according to claim 10, wherein, after the dynamic scanning suspending device suspends the dynamic scanning, before the dynamic scanning resuming device resumes the dynamic scanning, the manual scanning initiating device initiates as the manual scanning a scan suspended by the dynamic scanning suspending device during implementation of the dynamic scanning.

15. The imaging apparatus according to claim 10, further comprising a subject instructing device for giving instructions to the subject prior to each of the plurality of scans to be performed for implementation of the dynamic scanning.

16. The imaging apparatus according to claim 15, wherein the subject instructing device gives instructions to the subject by voice.

17. The imaging apparatus according to claim 15, wherein the subject instructing device gives respiratory instructions to the subject.

18. The imaging apparatus according to claim 15, wherein when the dynamic scanning resuming device resumes the dynamic scanning, the subject instructing device gives instructions to the subject so that the subject will get ready for a scan suspended by the dynamic scanning suspending device during implementation of the dynamic scanning.

* * * * *